(12) United States Patent
Masuda

(10) Patent No.: US 10,249,664 B2
(45) Date of Patent: Apr. 2, 2019

(54) OPTICAL GLASS

(71) Applicant: AGC Inc., Chiyoda-ku (JP)

(72) Inventor: Hidetaka Masuda, Haibara-gun (JP)

(73) Assignee: AGC Inc., Chiyoda-ku (JP)

( * ) Notice: Subject to any disclaimer, the term of this patent is extended or adjusted under 35 U.S.C. 154(b) by 298 days.

(21) Appl. No.: 15/073,119

(22) Filed: Mar. 17, 2016

(65) Prior Publication Data

US 2016/0197112 A1    Jul. 7, 2016

Related U.S. Application Data

(63) Continuation of application No. PCT/JP2014/074941, filed on Sep. 19, 2014.

(30) Foreign Application Priority Data

Sep. 25, 2013  (JP) .................................. 2013-198590
Nov. 26, 2013  (JP) .................................. 2013-244137

(51) Int. Cl.
  *B32B 3/10*  (2006.01)
  *H01L 27/146*  (2006.01)
  (Continued)

(52) U.S. Cl.
  CPC ........ *H01L 27/14625* (2013.01); *B23K 26/53* (2015.10); *C03B 33/0222* (2013.01);
  (Continued)

(58) Field of Classification Search
  None
  See application file for complete search history.

(56) References Cited

U.S. PATENT DOCUMENTS

2004/0002199 A1   1/2004  Fukuyo et al.
2004/0041518 A1*  3/2004  Yoneda ............... H01L 27/3272
                                                      313/506
(Continued)

FOREIGN PATENT DOCUMENTS

CN    103732550         4/2014
EP    2 228 167 A1      9/2010
(Continued)

OTHER PUBLICATIONS

English translation of the International Preliminary Report on Patentability and Written Opinion dated Apr. 7, 2016 in PCT/JP2014/074941 filed on Sep. 19, 2014.

(Continued)

*Primary Examiner* — Christopher M Polley
(74) *Attorney, Agent, or Firm* — Oblon, McClelland, Maier & Neustadt, L.L.P.

(57) ABSTRACT

To provide an optical glass, being an optical glass manufactured by a cutting method using laser light, more increases strength to make it difficult to cause breakage when external force such as impact is applied thereon, or more increases a bonding strength to a casing to more increase reliability of the product. An optical glass 100 is a plate-shaped optical glass to be bonded to a casing to cover an opening of the casing, the optical glass being made of a glass substrate 110 including: a first principal surface 110A being the side to be bonded to the casing; a second principal surface 110B being the side opposite to the first principal surface; and a cut surface cut along a reformed region R formed therein by light radiated to be focused therein, in which the reformed region R exists unevenly at the second principal surface 110B side.

7 Claims, 11 Drawing Sheets

(51) Int. Cl.
  *G02B 1/11* (2015.01)
  *C03B 33/02* (2006.01)
  *B23K 26/53* (2014.01)
  *G02B 5/28* (2006.01)
  *G02B 5/20* (2006.01)

(52) U.S. Cl.
  CPC .......... *G02B 1/11* (2013.01); *H01L 27/14618* (2013.01); *G02B 5/208* (2013.01); *G02B 5/28* (2013.01); *H01L 2924/0002* (2013.01); *Y02P 40/57* (2015.11)

(56) References Cited

U.S. PATENT DOCUMENTS

| | | |
|---|---|---|
| 2005/0173387 A1 | 8/2005 | Fukuyo et al. |
| 2005/0181581 A1 | 8/2005 | Fukuyo et al. |
| 2005/0184037 A1 | 8/2005 | Fukuyo et al. |
| 2005/0189330 A1 | 9/2005 | Fukuyo et al. |
| 2005/0194364 A1 | 9/2005 | Fukuyo et al. |
| 2006/0040473 A1 | 2/2006 | Fukuyo et al. |
| 2006/0160331 A1 | 7/2006 | Fukuyo et al. |
| 2010/0055876 A1 | 3/2010 | Fukuyo et al. |
| 2010/0176100 A1 | 7/2010 | Fukuyo et al. |
| 2010/0301521 A1 | 12/2010 | Uchiyama |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2012/0067858 A1* | 3/2012 | Kangastupa ......... B28D 5/0011 219/121.72 |
| 2012/0190175 A1 | 7/2012 | Fukuyo et al. |
| 2012/0205357 A1 | 8/2012 | Fukuyo et al. |
| 2012/0228276 A1 | 9/2012 | Fukuyo et al. |
| 2012/0279947 A1 | 11/2012 | Fukuyo et al. |
| 2013/0017670 A1 | 1/2013 | Fukuyo et al. |

FOREIGN PATENT DOCUMENTS

| | | |
|---|---|---|
| JP | 2000-169166 | 6/2000 |
| JP | 2002-192371 | 7/2002 |
| JP | 2008-1546 | 1/2008 |
| JP | 2009-135342 | 6/2009 |
| JP | 2010-168262 | 8/2010 |
| JP | 2010-197595 | 9/2010 |
| JP | 2013-75802 | 4/2013 |
| KR | 2014-0047626 | 4/2014 |
| TW | 201329005 A1 | 7/2013 |
| WO | WO 2013/027645 A1 | 2/2013 |
| WO | WO 2013/047157 A1 | 4/2013 |

OTHER PUBLICATIONS

International Search Report dated Dec. 16, 2014 in PCT/JP2014/074941 filed on Sep. 19, 2014 (with English translation).

Written Opinion dated Dec. 16, 2014 in PCT/JP2014/074941 filed on Sep. 19, 2014.

* cited by examiner

OPTICAL GLASS

CROSS-REFERENCE TO RELATED APPLICATIONS

This application is a continuation of prior International Application No. PCT/JP2014/074941, filed on Sep. 19, 2014 which is based upon and claims the benefit of priority from Japanese Patent Applications Nos. 2013-198590 filed on Sep. 25, 2013 and 2013-244137 filed on Nov. 26, 2013; the entire contents of all of which are incorporated herein by reference.

FIELD

The present invention relates to an optical glass, and particularly to an optical glass such as a cover glass or a near-infrared cut filter to be used by being bonded to a casing.

BACKGROUND

In semiconductor devices having solid state imaging devices such as a CCD (Charge Coupled Device) and a CMOS (Complementary Metal Oxide Semiconductor) to be used in digital still cameras and the like, optical glasses such as a near-infrared cut filter glass and a cover glass are used. In recent years, due to demands for a reduction in thickness of a solid state imaging device module to be mounted on a portable terminal such as a mobile phone or a smart phone and a reduction in thickness of a digital still camera, an optical glass having a thin plate thickness is required.

However, when the plate thickness of the optical glass is thinned, it becomes increasingly likely that fracture progresses starting from a chip or a microcrack existing in an edge line of the glass (boundary between a principal surface and a side surface of the glass) to cause breakage of the glass in the case when a bending stress acts on the optical glass.

Therefore, from a viewpoint of improving a bending strength of a glass, chamfering a glass edge surface has been proposed. This aims at increasing a bending strength of a glass by removing flaws in its glass edge surface to be a starting point of fracture by chamfering. Further, removing flaws in a principal surface of a glass plate by etching has been also proposed.

However, operations of the chamfering of a glass edge surface and the removing of flaws in a glass principal surface deteriorate (decrease) productivity of the optical glass. Further, a flaw is sometimes rather formed in the glass edge surface by the chamfering. This is caused because the chamfering of a glass is to mechanically process a glass with a grinding wheel. That is, an unintended flaw may be newly formed due to impact or the like during the chamfering. Further, when the etching is performed while holding the principal surface of the glass for the purpose of removing flaws in the principal surface of the glass, etching unevenness occurs on the principal surface being an optically effective surface, resulting in that optical characteristics as the optical glass may deteriorate (decrease).

In the meantime, as a cutting method of a semiconductor substrate and the like, Stealth Dicing (registered trademark) has been know. This cutting method is a technique of cutting a semiconductor element in a manner that laser light with a wavelength passing through a semiconductor substrate (for example, silicon (Si)) is collected inside the semiconductor substrate to form a reformed region (flaw region) inside the semiconductor substrate, and then an external stress such as a tape expansion is applied to cause a crack in the semiconductor substrate starting from the reformed region.

This cutting method enables the reformed region to be locally and selectively formed inside the semiconductor substrate without damaging the principal surface of the semiconductor substrate, and therefore it is possible to reduce occurrence of defects such as chipping in the principal surface of the semiconductor substrate that is a problem in general blade dicing. In addition, there are fewer problems such as dust occurrence unlike machining. Therefore, in recent years, the cutting method becomes to be widely used not only in cutting the semiconductor substrate but also in cutting a glass substrate.

SUMMARY

The present inventor applied this cutting method using laser light when manufacturing an optical glass and confirmed that a cut surface of the optical glass is smooth and flaws and the like are not easily formed in an edge line of the optical glass. That is, it was found out that strength of the optical glass manufactured by this cutting method can be maintained to some extent without performing the operations such as the chamfering and the etching as described above.

Further, an object of the present invention is to provide an optical glass having more increasingly reliability of the product at the time of manufacture of a product and use thereof, manufactured by Stealth Dicing.

As a result of earnest examinations for solving the above-described problems, the present inventors have found out an optical glass capable of increasing an effect of preventing breakage caused by external impact and the like or capable of increasing a bonding strength to a casing to improve hermeticity, and have completed the present invention.

That is, the optical glass of the present invention is an optical glass for covering an opening of the casing, comprising: a glass substrate with plate-shape comprising a first principal surface to be provided to be bonded to the casing, a second principal surface being the opposite to the first principal surface and an end surface; and a reformed region formed on the end surface at closer position to the second principal surface than the first principal surface or at closer position to the first principal surface than the second principal surface, made by light radiated to be focused thereto.

According to the optical glass of the present invention, by considering an aspect applied to a casing, at the time of manufacture of a product and use thereof, strength can be more increased and it makes it difficult to cause breakage by external force such as impact, or a bonding strength of the optical glass to the casing can be increased and hermeticity of a semiconductor element or the like can be well maintained, resulting in that it is possible to obtain a product having enhanced stability and reliability.

DETAILED DESCRIPTION

Hereinafter, there will be explained optical glasses according to embodiments in detail with reference to the drawings.

First Embodiment

[Optical Glass]

Figure 1A:
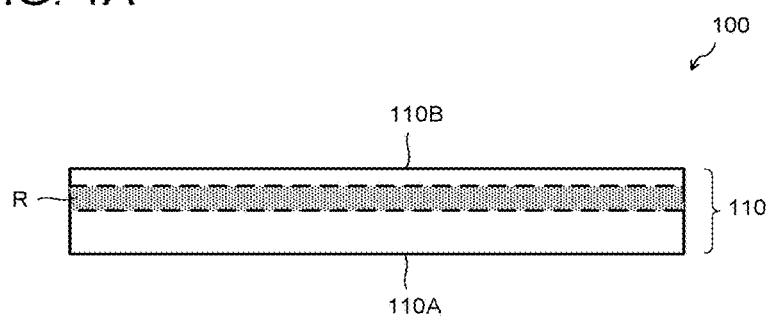
FIG. 1A is a side view of an optical glass according to a first embodiment of the present invention.
Figure 1B:
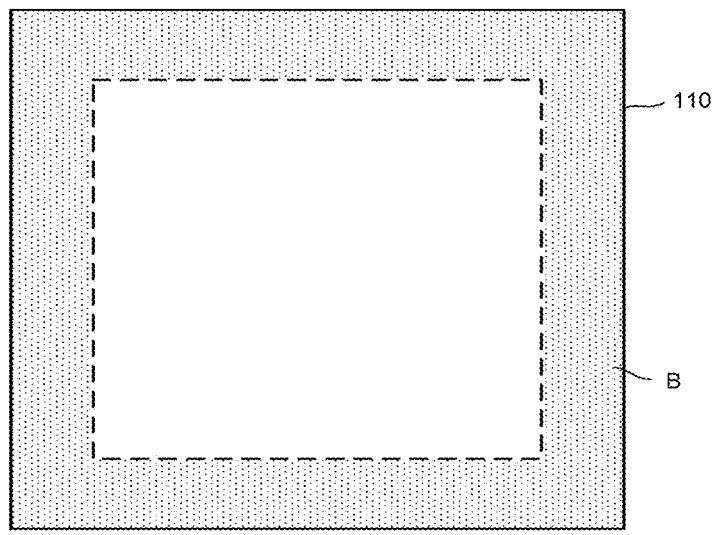
FIG. 1B is a bottom view of the optical glass in FIG. 1A.

FIG. 1A illustrates a side view of an optical glass according to the first embodiment of the present invention, and FIG. 1B illustrates a bottom view of the optical glass (plane view viewed from a first principal surface side). As illustrated in FIG. 1A and FIG. 1B, an optical glass 100 according to this embodiment is made of a glass substrate 110 to be a main body of the optical glass, and is used by being bonded to a casing so as to cover its opening.

<Glass Substrate>

The glass substrate 110 is a plate-shaped glass, and is a main body of the optical glass of this embodiment. This glass substrate 110 is used as a cover glass to be bonded to a casing so as to cover an opening portion of the casing. Therefore, the glass substrate 110 includes a first principal surface 110A being the side bonded to the casing and a second principal surface 110B being the side opposite to the first principal surface. Then, on an outer periphery side of the first principal surface 110A, a bonding region B for bonding to the casing is provided.

Further, the glass substrate 110 has an end surface being a cut surface cut along a reformed region R, the reformed region R being selectively formed inside a glass plate by laser light radiated to be focused inside the glass. That is, this glass substrate 110 is obtained in a manner that the reformed region R is formed by laser light inside the glass plate before being cut to cut in a desired shape and size and exterior force is applied to the glass plate to thereby cut the glass plate along the reformed region R. Therefore, the reformed region R is exposed on the side surface of this glass substrate 110, and the glass substrate 110 has a cut surface cut along the reformed region R in a plate thickness direction of the glass.

In this embodiment, it is characterized in that this reformed region R is unevenly formed at the second principal surface 110B side in the above-described cut surface. The reason for such unevenness is to improve the strength of the optical glass 100 when the optical glass 100 being applied to the casing by providing a difference between a bending strength of the first principal surface 110A side and a bending strength of the second principal surface 110B side of the optical glass 100.

How the bending strength changes depending on the formation position of the reformed region R expresses the following tendency. When the reformed region R is formed near the middle in the plate thickness direction of the glass substrate 110 as has been performed conventionally, for example, the bending strength becomes substantially the same at the first principal surface 110A and the second principal surface 110B. In the meantime, when the reformed region R is formed so as to exist unevenly at the second principal surface 110B side, the bending strength of the first principal surface 110A side to be bonded to the casing improves rather than when the reformed region R is formed near the middle, but the bending strength of the second principal surface 110B side being the surface on the side opposite thereto decreases rather than when the reformed region R is formed near the middle. By intentionally making the difference in the bending strength as above, the strength of the optical glass 100 is allowed to improve when the optical glass 100 is applied to the casing. The bending strength of the side where no reformed region R is made to exist unevenly (first principal surface 110A side in this embodiment) is preferably 1.3 or more times, more preferably 1.5 or more times, and still more preferably 2 or more times larger than the bending strength of the side where the reformed region R is made to exist unevenly (second principal surface 110B side in this embodiment). In the meantime, when the difference in the bending strength is too large, the bending strength of the side where the reformed region R is made to exist unevenly decreases excessively to increase the risk of breakage of the optical glass during manufacture or transport, and therefore the bending strength of the side where no reformed region R is made to exist unevenly is preferably five or less times and more preferably four or less times larger than the bending strength of the side where the reformed region R is made to exist unevenly.

Incidentally, the bending strength of the first principal surface 110A side means a strength when the optical glass 100 is bent to be broken by loading a load onto the second principal surface 110B side so that the first principal surface 110A forms a convex shape. Further, the bending strength of the second principal surface 110B side means a strength when the optical glass 100 is bent to be broken by loading a load onto the first principal surface 110A side so that the second principal surface 110B forms a convex shape.

Figure 2:
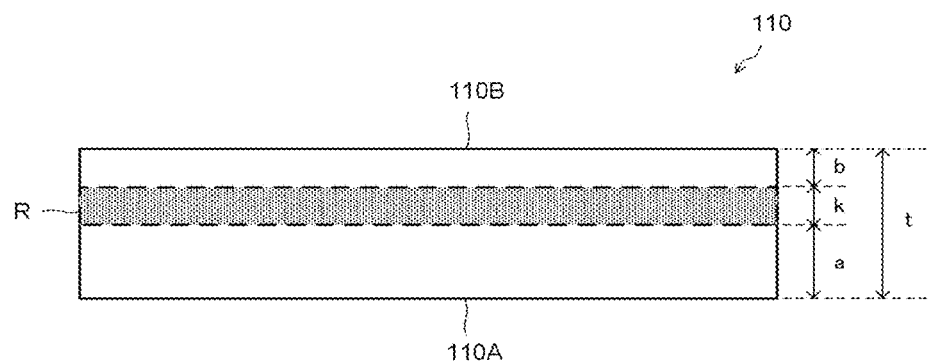
FIG. 2 is a view for explaining positional relationships of a reformed region in the optical glass in FIG. 1A.

The forming position of the reformed region R will be explained with reference to FIG. 2. FIG. 2 is a view conceptually illustrating the side surface of the optical glass 100. As illustrated in FIG. 2, when in the plate thickness direction of the glass substrate 110, the distance between the first principal surface 110A and the reformed region R is set to a, the distance between the second principal surface 110B and the reformed region R is set to b, the thickness of the glass substrate 110 is set to t, and the width of the reformed region R is set to k, it is preferred that the reformed region should exist unevenly at the second principal surface 110B side so as to satisfy Expression (1) below.

$$(a-b)/2>0.02t \quad (1)$$

Here, the distance a and the distance b are numerical values greater than 0 (zero), which means that it is essential for the reformed region R to be formed apart from the respective principal surfaces. Further, the width k of the reformed region R is preferably less than the thickness t of the glass substrate 110×0.7 (namely, plate thickness×70%), more preferably less than the thickness t of the glass substrate 110×0.4 (namely, plate thickness×40%), and further preferably less than the thickness t of the glass substrate 110×0.3 (namely, plate thickness×30%). Further, the width k of the reformed region R is preferably equal to or more than the thickness t of the glass substrate 110×0.02 (namely, plate thickness×2%) and more preferably equal to or more than the thickness t of the glass substrate 110×0.05 (namely, plate thickness×5%).

Further, the reformed region R is preferably formed a certain distance or more apart from the respective principal surfaces, and for example, the distance a and the distance b are each preferably equal to or more than the thickness t of the glass substrate 110×0.1 (namely, plate thickness×10%).

When (a−b)/2 exceeds 0.02t (namely, plate thickness× 2%), the bending strength of the first principal surface 110A side can be increased drastically compared to the bending strength of the second principal surface 110B side.

Further, the distance a between the first principal surface 110A and the reformed region means a distance between a point where a peak count value Pc of the cut surface (value measured in the direction parallel to the principal surfaces) is confirmed from the first principal surface 110A to the second principal surface 110B to be greater than 20 for the first time and the first principal surface 110A.

Further, the distance b between the second principal surface 110B and the reformed region means a distance between a point where the peak count value Pc of the cut surface (value measured in the direction parallel to the principal surfaces) is confirmed from the second principal surface 110B to the first principal surface 110A to be greater than 20 for the first time and the second principal surface 110B.

In Expression (1) above, "(a−b)/2" represents a displacement amount between the middle of the reformed region R in the plate thickness direction and the plate thickness middle of the optical glass 100. Therefore, Expression (1) means that the displacement amount of the reformed region R to the second principal surface 110B side exceeds the plate thickness×2%, and when this relation is satisfied, the bending strength of the first principal surface side can be improved drastically.

As for the forming position of the reformed region R, when in the plate thickness direction of the glass substrate 110, the distance between the first principal surface 110A and the reformed region R is set to a, the distance between the second principal surface 110B and the reformed region R is set to b, the thickness of the glass substrate 110 is set to t, and the width of the reformed region R is set to k, it is more preferred that the reformed region should exist unevenly at the second principal surface 110B side so as to satisfy Expression (2) below.

$$0.05t<(a-b)/2<0.3t \quad (2)$$

Here, the distance a and the distance b are numerical values greater than 0 (zero), which means that it is essential for the reformed region R to be formed apart from the respective principal surfaces. Further, the reformed region R is preferably formed a certain distance or more apart from the respective principal surfaces, and for example, the distance a and the distance b are each preferably equal to or more than the thickness t of the glass substrate 110×0.1 (namely, plate thickness×10%).

When (a−b)/2 exceeds 0.05t, the bending strength of the first principal surface 110A side can be increased drastically compared to the bending strength of the second principal surface 110B side. Further, since (a−b)/2 is less than 0.3t, the bending strength of the second principal surface 110B side does not decrease excessively. Further, satisfying Expression (2) makes it possible to obtain the optical glass 100 having 300 MPa or more of the bending strength of the first principal surface 110A side and having 100 MPa or more of the bending strength of the second principal surface 110B side. Incidentally, the distance a and the distance b are numerical values greater than 0 (zero). That is, the reformed region R is formed apart from the respective principal surfaces.

The reformed region R is made to exist unevenly as above, thereby making it possible to adjust the bending strength of the optical glass. The reformed region R may also be formed between the middle of the glass substrate 110 and the second principal surface 110B in the plate thickness direction. That is, without ranging over the middle of the glass substrate 110, the reformed region R is formed only between the middle of the glass substrate 110 and the second principal surface 110B in the cut surface, thereby making it possible to further increase the bending strength of the first principal surface 110A side.

The reformed region R and the remaining region in the cut surface of the optical glass 100 can be determined by the peak count value of the cut surface. The peak count value Pc means the number of peaks in an evaluation length, counted by a method of setting a range from a negative reference level (−H) to a positive reference level (+H) as one peak with a mean line of curves expressing a surface state (irregularities) of an object to be measured being the center, which is defined by American Society of Mechanical Engineers ASME B46.1 (1995).

In the present invention, the peak count value is first measured on the cut surface of the optical glass 100 in the direction parallel to the respective principal surfaces. This measurement is performed a plurality of times while changing the position in the plate thickness direction of the optical glass 100. Then, while using the peak count values at the positions in the plate thickness direction on the cut surface of the optical glass 100, the peak count values Pc measured in the direction from the first principal surface 110A to the second principal surface 110B are confirmed and the distance between the measurement position where the peak count value Pc exceeds 20 for the first time and the first principal surface 110A is set to the distance a. In the same manner, while using the peak count values at the positions in the plate thickness direction on the cut surface of the optical glass 100, the peak count values Pc measured in the direction from the second principal surface 110B to the first principal surface 110A are confirmed and the distance between the measurement position where the peak count value Pc exceeds 20 for the first time and the second principal surface 110B is set to the distance b.

As long as this peak count value measurement is performed while confirming a boundary position between the reformed region R and the remaining region based on an optical micrograph of the cut surface, the distance a and the distance b can be determined efficiently and precisely.

Further, when the measurement position is changed to the plate thickness direction, the measurement is preferably performed at an interval equal to or less than the thickness t of the glass substrate 110×0.04 (namely plate thickness× 4%) in the vicinity of the boundary position between the reformed region R and the remaining region in particular. This enables more precise boundary position determination.

Incidentally, the peak count value of the cut surface can be obtained as the number of peaks defined by the following manner. Namely, one peak can be given by a form starting from a point exceeding below a dead zone set on a measured waveform measured in the direction parallel to the respective principal surfaces, via a point exceeding above the dead zone on the measured waveform, to a point again exceeding below the dead zone on the measured waveform as a unit. The width of the dead zone (the dead zone width) is given as the maximum height of the measured waveform×0.05 with respect to the mean line of the measured waveform as a center.

The measurement is performed using a laser microscope (shape measurement laser microscope VK-X100 and analysis software: VK-H1XA manufactured by KEYENCE CORPORATION), and its condition is set as follows: evaluation length (measurement width): 725 μm (magnification: 200 times); wavelength: 628 nm; and no measured waveform correction in the analysis software.

Even the bonding to the casing is considered and the position of the reformed region R of the glass substrate is selectively formed as above, thereby making it possible to enhance stability and reliability of a product.

Figure 3:
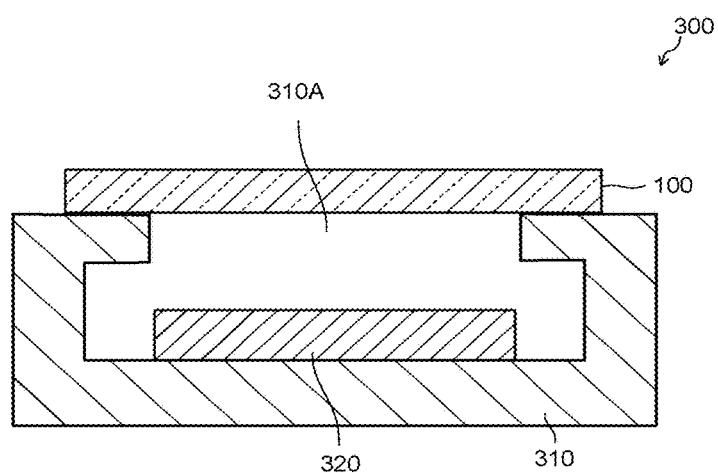
FIG. 3 is a view where the optical glass in FIG. 1A is applied to a casing.

The reason why the strength of the optical glass can be increased by making the reformed region R exist unevenly is considered as follows. First, FIG. 3 illustrates a cross-sectional view of a semiconductor device 300 with the optical glass 100 applied to a casing 310. Here, the optical glass 100 is bonded to the casing 310 so as to cover an opening portion 310A of the casing 310. When this semiconductor device 300 is an imaging device to be mounted on, for example, a potable electronic device (for example, a portable terminal such as a mobile phone or a smart phone), a strong impact is sometimes added to the imaging device due to dropping or the like. When the imaging device receives the impact as above, the impact is added strongly also to the optical glass 100 similarly. When the optical glass 100 is bent in the plate thickness direction of the optical glass 100 due to the impact, a state of the optical glass 100 to be displaced in a direction going away from the casing 310 and a state of the optical glass 100 to come into close contact with the casing 310 to be displaced in a direction approaching the semiconductor element 320 side are repeated alternately and this amplitude becomes small gradually, resulting in absorption of the impact.

When the optical glass 100 is displaced in a direction going away from the casing 310, a stress substantially acting on the optical glass 100 is absorbed by an elastic force of an adhesive (thermosetting resin, ultraviolet curing resin, or the like) bonding the optical glass 100 and the casing 310 together to be small. The optical glass 100 does not come into contact with other members at this time, so that a high stress does not act on the optical glass 100 locally.

In contrast to this, when the optical glass 100 comes into close contact with the casing 310 to be displaced in a direction approaching the semiconductor element 320 side, the optical glass 100 and an end portion of the opening 310A of the casing 310 come into close contact with each other and a high stress locally acts on the optical glass 100. Thereby, it is considered that the stress acting on the optical glass 100 propagates in a planar direction, fracture extends starting from a chip, a microcrack, or the like, and therefore the optical glass 100 is broken.

By increasing the bending strength of the bonded surface side of the optical glass 100 of this embodiment to the casing 310, the breakage caused by impact can be suppressed even when such impact as the optical glass 100 is displaced in the plate thickness direction is added as described above. That is, even when a force to bring the optical glass 100 to come into close contact with the casing 310 to be displaced in a direction approaching the semiconductor element 320 side is added, the strength to withstand it is larger than ever before, and therefore it is possible to suppress the breakage of the optical glass 100 caused by impact due to dropping or the like of the semiconductor device 300.

Incidentally, for the bending strengths of the respective surfaces, a measuring method in conformity with a three-point bending strength test or a four-point bending strength test of JIS R 1601 (2008) is used. Further, when the dimensions of a test piece are different from those of a standard test piece defined in JIS described above, the size of a bending test testing jig for defined in JIS described above is changed according to the dimensions of the test piece, and then the measurement is performed.

Incidentally, the semiconductor device 300 described here is made by housing the semiconductor element 320 in the casing 310, the optical glass 100 of this embodiment is bonded to the casing 310 so as to cover the opening portion 310A of the casing 310, and the casing 310 is airtightly sealed. Here, the bonding is made by sealing the bonding region B of the first principal surface 110A of the optical glass 100 and a casing forming the opening portion 310A of the casing 310 with a thermosetting resin, an ultraviolet curing resin, or the like. Further, as long as being a well-known one, the semiconductor element 320 can be used without any limitation in particular, and solid state imaging devices (for example, a CCD and a CMOS) and the like are exemplified. Particularly, a semiconductor device to be applied to a mobile portable electronic device is preferable because it is highly likely to receive a drop impact or the like.

Further, the glass substrate 110 used in this embodiment is preferably formed of glass having fracture toughness in a range of 0.2 MPa·m$^{1/2}$ to 0.74 MPa·m$^{1/2}$ and having a thermal expansion coefficient in a range of 75×10$^{-7}$/K to 150×10$^{-7}$/K.

The fracture toughness of the glass substrate 110 is a value ($K_{1c}$) calculated by the following expression in the indentation fracture method (IF method) defined by JIS R1607.

$$K_{1c} = 0.026 \cdot E^{1/2} \cdot P^{1/2} \cdot a / C^{3/2}$$

Here, E represents a Young's modulus (Pa), P represents an indentation load (N), a represents ½ of the average of an indentation diagonal line length (m), and C represents ½ of the average of a crack length (m).

Further, the thermal expansion coefficient of the glass substrate 110 is an average value of values measured by the differential expression defined by JIS R3102 and measured at 100° C. to 300° C.

When the fracture toughness of the glass substrate 110 exceeds 0.74 MPa·m$^{1/2}$, cracks are unlikely to occur in the reformed region R at the time of forming the reformed region R in the glass substrate 110 by laser light, resulting in difficulty in cutting the glass substrate 110. Further, at the time of cutting the glass substrate 110 starting from the reformed region R, cracks are unlikely to extend in the plate thickness direction, so that the glass substrate 110 is forcedly cut, resulting in a rough cut surface of the glass substrate 110 and a decreased dimensional accuracy. Further, even if the cracks occurring in the reformed region R are formed to be large so as to sufficiently extend, cracks extending in directions other than the plate thickness direction become large, resulting in a rough cut surface of the cut glass substrate 110. This may decrease the dimensional accuracy and the bending strength of the glass substrate 110.

On the other hand, when the fracture toughness of the glass substrate 110 is less than 0.2 $MPa \cdot m^{1/2}$, cracks are likely to occur in the reformed region R at the time of forming the reformed region R in the glass substrate 110 by laser light, and therefore, cracks reaching the glass substrate 110 or the surface of the glass substrate 110 are formed from the reformed region R of the glass substrate 110, bringing about a problem that the cut glass substrate 110 is likely to be chipped or cracked. Further, even if cracks are formed to be small so as not to form into cracks starting from the reformed region R and reaching the glass substrate 110 or the surface of glass substrate 110, the cracks are likely to excessively extend starting from the reformed region R, and therefore, cracks extend also in directions other than the plate thickness direction, resulting in a rough cut surface of the glass substrate 110. This may decrease the dimensional accuracy and the bending strength of the glass substrate 110. Further, when the fracture toughness is less than 0.2 $MPa \cdot m^{1/2}$, cracks existing in the cut surface of the glass substrate 110, even if minute, cause breakage, so that the glass substrate 110 after cutting may have a bending strength not enough for practical use.

When the thermal expansion coefficient of the glass constituting the glass substrate 110 exceeds $150 \times 10^{-7}/K$, cracks are formed too large in the reformed region R at the time of forming the reformed region R inside the glass by laser light, resulting in significant decrease in dimensional accuracy and bending strength of the optical glass 100 after cutting. On the other hand, when the thermal expansion coefficient of the glass substrate 110 is less than $75 \times 10^{-7}/K$, cracks are unlikely to occur in the reformed region R at the time of forming the reformed region R inside the glass by laser light, resulting in difficulty in cutting the optical glass 100.

The glass substrate 110 can be used by appropriately selecting from materials transparent in a visible wavelength region. For example, a borosilicate glass is processed easily and can suppress occurrence of flaws, foreign matters, and the like on an optical surface, thus being preferable, and a glass containing no alkaline component has good adhesiveness, weather resistance, and the like, thus being preferable.

As the glass to be used here, a fluorophosphate-based glass or a phosphate-based glass can also be used. A light absorption type glass having absorption in an infrared wavelength region, in which CuO and/or the like have/has been added to the fluorophosphate-based glass or phosphate-based glass, is preferable. Particularly, the fluorophosphate-based glass or phosphate-based glass having had CuO added thereto has high transmittance to light of a visible wavelength region, and additionally can give a good near-infrared light cut function because CuO sufficiently absorbs light of a near-infrared wavelength region.

Specific examples of the fluorophosphate-based glass containing CuO include glasses containing, in cation %, 20 to 45% of $P^{5+}$, 1 to 25% of $Al^{3+}$, 1 to 30% of $R^+$ (where $R^+$ is the total content of $Li^+$, $Na^+$, and $K^+$), 1 to 15% of $Cu^{2+}$, and 1 to 50% of $R^{2+}$ (where $R^{2+}$ is the total content of $Mg^{2+}$, $Ca^{2+}$, $Sr^{2+}$, $Ba^{2+}$, and $Zn^{2+}$), and in anion %, 10 to 65% of $F^-$, and 35 to 90% of $O^{2-}$. As a commercially available product, an NF-50 glass (manufactured by AGC TECHNO GLASS CO., LTD.) and the like are exemplified.

Specific examples of the phosphate-based glass containing CuO include glasses containing, in mass % in terms of the following oxides, 65 to 74% of $P_2O_5$, 5 to 10% of $Al_2O_3$, 0.5 to 3% of $B_2O_3$, 0 to 10% of $Li_2O$, 3 to 10% of $Na_2O$, 3 to 15% of $Li_2O+Na_2O$, 0 to 2% of MgO, 0 to 2% of CaO, 0 to 5% of SrO, 0 to 9% of BaO, 3 to 15% of MgO+CaO+SrO+BaO, and 0.5 to 20% of CuO, where $Na_2O/(Li_2O+MgO+CaO+SrO+BaO)$ is 0.5 to 3. Incidentally, a glass composition is not limited to the ones described above, and an appropriate glass can be used.

The thickness of the glass substrate 110 is not limited in particular, but from the standpoints of reduction in size and reduction in weight, the 0.1 to 3 mm range is preferable, and the 0.1 to 1 mm range is more preferable.

Figure 4:
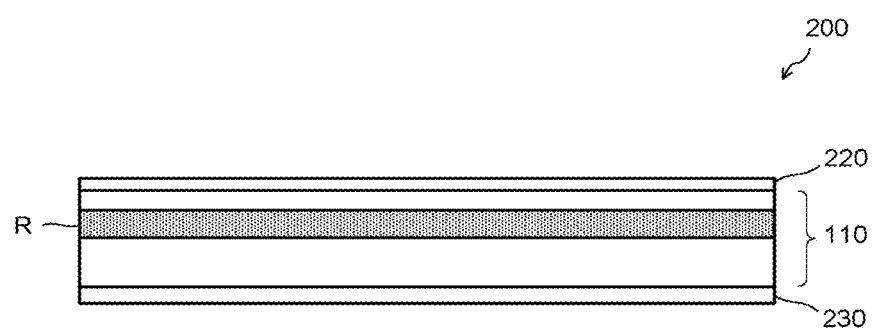
FIG. 4 is a side view of the optical glass in FIG. 1A with optical thin films provided thereon.

Further, in the optical glass of this embodiment, an optical thin film can also be formed on the principal surfaces of the glass substrate 110 as necessary. For example, FIG. 4 illustrates an optical glass to be used as an infrared cut filter as an example, and an optical glass 200 is made by including: the glass substrate 110; an optical thin film 220 formed on the second principal surface 110B of the glass substrate 110; and an optical thin film 230 formed on the first principal surface 110A of the glass substrate 110.

Here, the optical thin film 230 is an anti-reflection film, and is provided on the first principal surface 110A of the glass substrate 110 to be the side bonded to the casing. The optical thin film 230 decreases reflectance of the principal surface of the optical glass 200 to increase its transmittance. The optical thin film 230 is composed, for example, of a single layer film of $MgF_2$, a multilayer film made by stacking a mixture film of $Al_2O_3 \cdot TiO_2$ and $ZrO_2$ and $MgF_2$, an alternate multilayer film of $SiO_2 \cdot TiO_2$, or the like. These single layer•multilayer films are formed on the first principal surface 110A of the glass substrate 110 by a film forming method such as vacuum deposition or sputtering. Further, the physical film thickness of the optical thin film 230 is preferably 0.2 μm to 8 μm.

Further, the optical thin film 220 is a UVIR cut film that cuts ultraviolet light (UV) and infrared light (IR), and is provided on the second principal surface 110B of the glass substrate 110. The optical thin film 220 is composed, for example, of a multilayer film made by stacking dielectric films different in refractive index such as $SiO_2 \cdot TiO_2$, a resin film containing an ultraviolet absorbent and an infrared absorbent, or the like. The multilayer film can be formed on the second principal surface 110B of the glass substrate 110 by a film forming method such as vacuum deposition or sputtering, and the resin film can be formed on the second principal surface 110B of the glass substrate 110 by a well-known film forming method in which a resin dispersed or dissolved in a solvent is applied to be dried. Further, the physical film thickness of the optical thin film 220 is preferably 0.2 μm to 8 μm.

Incidentally, although the optical thin film 230 is provided on the first principal surface 110A of the glass substrate 110 and the optical thin film 220 is provided on the second principal surface 110B of the glass substrate 110 in the above-described explanation, it is also possible that the optical thin film 230 is provided on the second principal surface 110B of the glass substrate 110 and the optical thin film 220 is provided on the first principal surface 110A of the glass substrate 110. Further, the optical thin films 220 and 230 may also be provided on the first principal surface 110A of the glass substrate 110 and the optical thin films 220 and 230 may also be provided on the second principal surface 110B of the glass substrate 110. Further, when the glass substrate 110 can sufficiently absorb light in a near-infrared wavelength region, only the optical thin film to cut ultraviolet light (UV) may also be provided as the optical thin film 230.

[Manufacturing Method of Optical Glass]

Next, there will be explained a manufacturing method of the optical glass in this embodiment with reference to the drawings.

(Cutting Apparatus for Glass Substrate)

Figure 5:
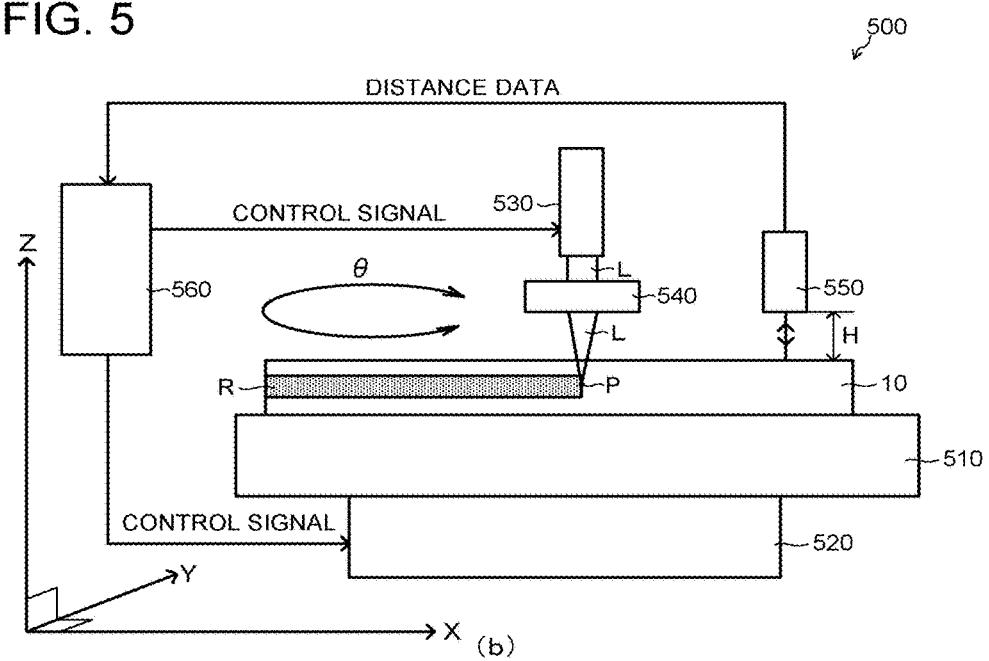
FIG. 5 is a schematic view of a cutting apparatus for a glass substrate according to the first embodiment.

FIG. 5 is a schematic view of a cutting apparatus 500 for the glass substrate according to this embodiment. As illustrated in FIG. 5, the cutting apparatus 500 includes: a table 510; a driving mechanism 520; a laser light radiation mechanism 530; an optical system 540; a distance measuring system 550; and a control mechanism 560.

The table 510 is a table for allowing a glass plate 10 being a cutting object (a glass plate before being subjected to cutting to be manufactured into the optical glass 100) to be mounted. The glass plate 10 is mounted on the table 510. Note that the table 510 is constituted so as to be movable in X, Y, and Z directions illustrated in FIG. 5. Further, the table 510 is constituted so as to be rotatable in a θ direction illustrated in FIG. 5 in an XY plane.

The driving mechanism 520 is coupled to the table 510 and moves, based on an instruction from the control mechanism 560, the table 510 in the horizontal directions (X and Y directions), the vertical direction (Z direction), and the rotation direction (θ direction). The laser light radiation mechanism 530 is a light source that radiates laser light L. Note that a YAG laser is preferably used for the light source. This is because it can provide a high laser intensity and is power-saving and relatively inexpensive.

In the case of the YAG laser, a center wavelength of the laser light L to be output is 1064 nm, but nonlinear optical crystals are used to generate harmonics, and thereby laser light having a center wavelength of 532 nm (green) or laser light having a center wavelength of 355 nm (ultraviolet light) can also be obtained. In this embodiment, because of cutting the glass plate 10, a light source to output laser light having a center wavelength of 532 nm is used. This is because the laser light having a center wavelength of 532 nm is the most transmittable through the glass plate 10 and is suitable for cutting.

Incidentally, one capable of radiating pulsed laser light is preferably used for the laser light radiation mechanism 530. Further, as the laser light radiation mechanism 530, one for which the wavelength, pulse width, repetition frequency, radiation time, energy intensity, and the like of the laser light L can be arbitrarily set according to the thickness (plate thickness) of the glass plate 10 and the size of the reformed region to be formed is preferably used.

The optical system 540 includes an optical lens OL, and converges the laser light from the laser light radiation mechanism 530 to the inside of the glass plate 10. In other words, the optical system 540 forms a collecting point P inside the glass plate 10 to form the reformed region R inside the glass plate 10. The distance measuring system 550 is, for example, a laser distance meter and measures a distance H to the principal surface of the glass plate 10 by a triangulation method. The distance measuring system 550 measures the distance H to the principal surface of the glass plate 10 at predetermined time intervals (for example, every several milliseconds), and outputs the measured distance H to the control mechanism 560.

The control mechanism 560 controls the driving mechanism 520 to move the table 510 so that the laser light is radiated along a cutting line (hereinafter, a planned cutting line) planned on the glass plate 10, and the laser light radiation mechanism 530 radiates the laser light to the glass plate 10. Further, the control mechanism 560 adjusts the height of the table 510 based on distance information output from the distance measuring system 550. Incidentally, the control mechanism 560 may also adjust the position of the lens of the optical system 540 based on the distance information output from the distance measuring system 550.

More specifically, the control mechanism 560 controls the driving mechanism 520 to make the distance H between the optical system 540 and the glass plate 10 fall within a fixed range (for example, from −5 μm to +5 μm) to thereby adjust the position of the glass plate 10 in the height direction (Z direction). As for the position of the reformed region R, the height of the glass plate 10 is adjusted as above to bring the collecting point of the laser light to a desired position in the thickness direction of the glass plate 10.

<Cutting Method>

Figure 6A:
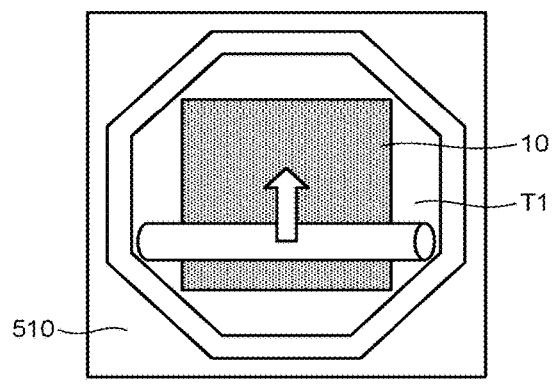
FIG. 6A is an explanatory view of a cutting method of the glass substrate according to the first embodiment.
Figure 6B:
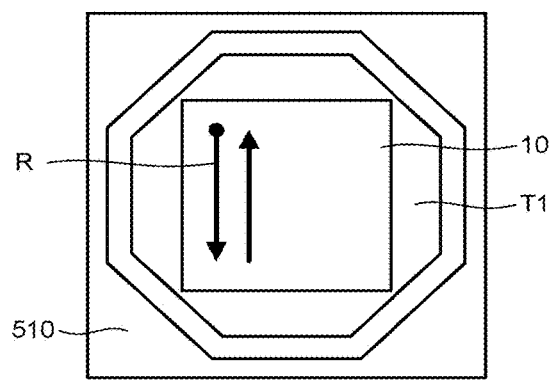
FIG. 6B is an explanatory view of the cutting method of the glass substrate according to the first embodiment.
Figure 6C:
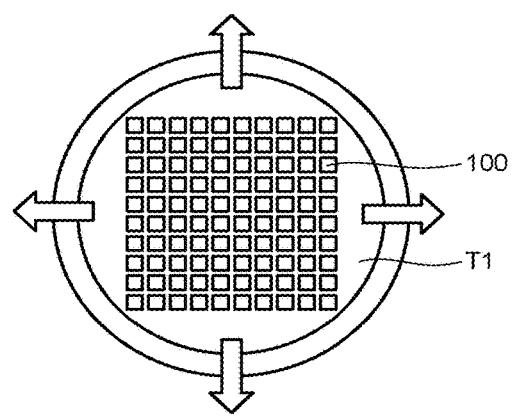
FIG. 6C is an explanatory view of the cutting method of the glass substrate according to the first embodiment.

FIG. 6A to FIG. 6C are explanatory views of a cutting method of the glass plate 10. Hereinafter, the cutting method of the glass plate 10 will be explained with reference to FIG. 6A to FIG. 6C.

The glass plate 10 is bonded to a tape T1 for expansion with the side where the optical thin film 230 is provided positioned on the upper side, and the glass plate 10 is mounted on a stage 510 of the cutting apparatus 500 explained referring to FIG. 5 (FIG. 6A). Note that the single glass plate 10 is bonded to the tape T1 in FIG. 6A, but the number of glass plates 10 to be bonded to the tape T1 may also be plural.

Next, the cutting apparatus 500 is used to radiate the laser light to the glass plate 10 along the planned cutting line, to thereby form the reformed region R (FIG. 6B). The planned cutting line is a lattice-patterned scanning line made so that the planar shape of the optical glass obtained by cutting becomes a square shape or rectangular shape. Incidentally, the reformed region R may also be formed by scanning with the laser light a plurality of times along the planned cutting line. In other words, scanning with the laser light may also be performed a plurality of times along the planned cutting line with the collecting point of the laser light made different in the plate thickness direction of the glass plate 10.

Incidentally, when scanning with the laser light is performed a plurality of times with the collecting point of the laser light made different in the plate thickness direction of the glass plate 10, unreformed regions are sometimes generated between a plurality of reformed regions formed by the scanning with the laser light. This means that the width k of the reformed region R is the range between a reformed region formed at a place closest to the first principal surface and a reformed region formed at a place closest to the second principal surface (namely the range including also unreformed regions existing between the above-described plurality of reformed regions).

When the anti-reflection film has been formed on the principal surface being the laser light radiated side of the glass plate 10 at this time, the laser light is unlikely to be reflected on the principal surface of the glass plate 10. This makes it possible to suppress a decrease in energy efficiency of the laser light entering the inside of the glass plate 10. As a result, it is possible to decrease the occurrence possibility of a problem such that a desired reformed region R cannot be formed at a desired position.

Next, by expanding the tape T1 in outline arrow directions, a tensile cutting stress is applied to the glass plate 10. Thereby, the glass plate 10 is cut into individual pieces along planned cutting lines starting from the reformed region R formed in the glass plate 10 (FIG. 6C).

As described above, according to the cutting method of the glass plate and the glass substrate according to this embodiment, cracks occur starting from the reformed region R formed inside the glass plate 10, so that the glass plate 10 can be easily cut. Further, by pulling the glass plate 10 in a planar direction, the cracks formed in the reformed region R are likely to extend in the plate thickness direction of the glass substrate, thus making the cut surface of the glass substrate unlikely to be rough and making it possible to obtain the optical glass 100 having an excellent dimensional accuracy.

Figure 7:
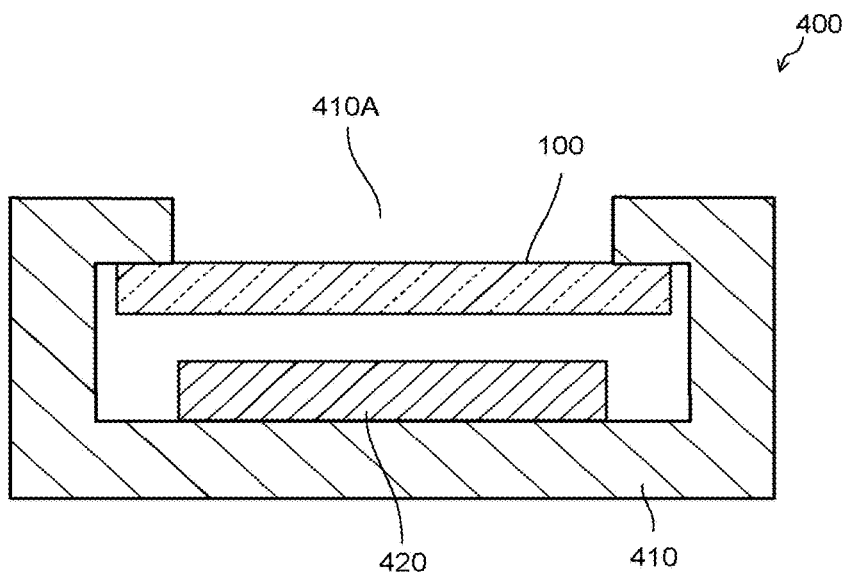
FIG. 7 is a view where the optical glass in FIG. 1A is applied to a casing of another embodiment.

Incidentally, as another embodiment obtained by modifying the first embodiment, FIG. 7 illustrates a cross-sectional view of a semiconductor device 400 in which the optical glass 100 is applied to a casing 410. Here, the optical glass 100 is bonded to the casing 410 so as to cover an opening portion 410A of the casing 410. In this embodiment, the first principal surface of the optical glass 100 is bonded to the casing 410 from the inside of the device, and therefore the optical glass 100 is used in a turnover state compared to the optical glass 100 in FIG. 3 and a reformed region is unevenly formed at the semiconductor element 420 side.

Second Embodiment

[Optical Glass]

Figure 8A:
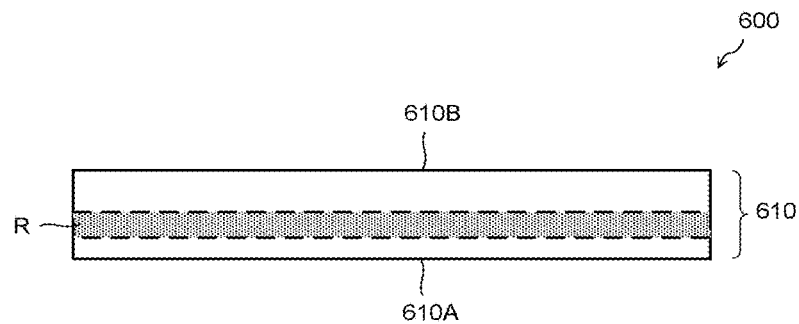
FIG. 8A is a side view of an optical glass according to a second embodiment of the present invention.
Figure 8B:
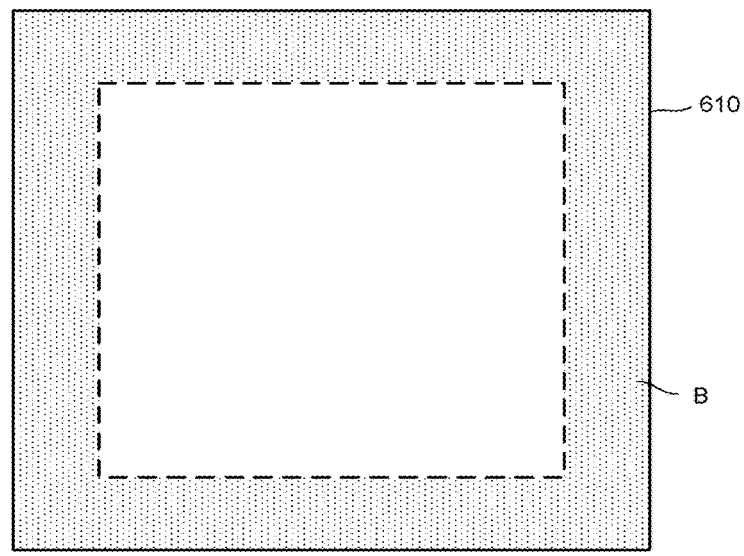
FIG. 8B is a bottom view of the optical glass in FIG. 8A.

FIG. 8A illustrate a side view of an optical glass according to the second embodiment of the present invention, and FIG. 8B illustrates a bottom view of the optical glass (plane view viewed from a first principal surface side). As illustrated in FIG. 8A and FIG. 8B, an optical glass 600 according to this embodiment is made of a glass substrate 610 to be a main body of the optical glass, and is used by being bonded to a casing so as to cover its opening.

<Glass Substrate>

The glass substrate 610 is a plate-shaped glass, and is a main body of the optical glass of this embodiment. This glass substrate 610 is used as a cover glass to be bonded to a casing so as to cover an opening portion of the casing. Therefore, the glass substrate 610 includes a first principal surface 610A being the side bonded to the casing and a second principal surface 610B being the side opposite to the first principal surface. Then, on an outer periphery side of the first principal surface 610A, a bonding region B for bonding to the casing is provided.

Further, the glass substrate 610 has an end surface being a cut surface cut along a reformed region R, the reformed region R being selectively formed by laser light radiated to be focused inside the glass in its side surface. That is, this glass substrate 610 is obtained in a manner that the reformed region R is formed by laser light inside of a glass plate before being cut to cut a desired shape and size and exterior force is applied to the glass plate to thereby cut the glass plate along the reformed region R. Therefore, the reformed region R is exposed on the side surface of this glass substrate 610, and the glass substrate 610 has a cut surface cut in a plate thickness direction of the glass along the reformed region R.

In this embodiment, it is characterized in that this reformed region R is unevenly formed at the first principal surface 610A side in the above-described cut surface. The reason for such unevenness is because the reformed region is provided close to the first principal surface 610A in the cut surface of the optical glass 600, and thereby when the glass substrate 610 and the casing are bonded together, an adhesive that has run around onto the side surface of the glass substrate 610 runs into the reformed region R, to thereby further improve a bonding strength with the casing.

It is considered that the reformed region R formed in the side surface of the glass substrate 610 does not have a mirror surface but has a surface having fine irregularities because it is formed by the laser light and when the adhesive runs into the irregularities, a bonded area with the adhesive increases, resulting in that the bonding strength of the glass substrate 610 to the casing can be improved.

Figure 9:
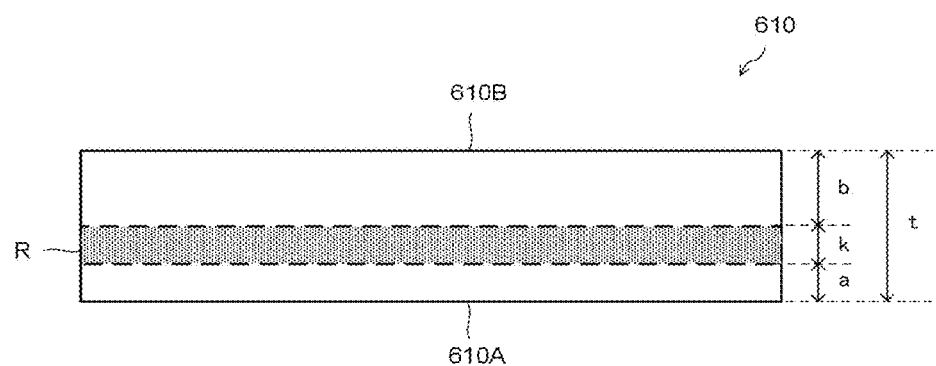
FIG. 9 is a view for explaining positional relationships of a reformed region in the optical glass in FIG. 8A.

The forming position of the reformed region R will be explained with reference to FIG. 9. FIG. 9 is a view conceptually illustrating the side surface of the optical glass 600. As illustrated in FIG. 9, when in the plate thickness direction of the glass substrate 610, the distance between the first principal surface 610A and the reformed region R is set to a, the distance between the second principal surface 610B and the reformed region R is set to b, the thickness of the glass substrate 610 is set to t, and the width of the reformed region R is set to k, it is preferred that the reformed region should exist unevenly at the first principal surface 610A side so as to satisfy Expression (3) below.

$$(b-a)/2 > 0.02t \qquad (3)$$

Here, the distance a and the distance b are numerical values greater than 0 (zero), which means that it is essential for the reformed region R to be formed apart from the respective principal surfaces. Further, the width k of the reformed region R is preferably less than the thickness t of the glass substrate $610 \times 0.7$ (namely, plate thickness×70%), more preferably less than the thickness t of the glass substrate $610 \times 0.4$ (namely, plate thickness×40%), and further preferably less than the thickness t of the glass substrate $610 \times 0.3$ (namely, plate thickness×30%). Further, the width k of the reformed region R is preferably equal to or more than the thickness t of the glass substrate $610 \times 0.02$ (namely, plate thickness×2%) and more preferably equal to or more than the thickness t of the glass substrate $610 \times 0.05$ (namely, plate thickness×5%).

Further, the reformed region R is preferably formed a certain distance or more apart from the respective principal surfaces, and for example, the distance a and the distance b are each preferably equal to or more than the thickness t of the glass substrate $610 \times 0.1$ (namely, plate thickness×10%).

When (b−a)/2 exceeds 0.02t (namely, plate thickness× 2%), the adhesive for bonding the casing and the optical glass together is allowed to solidify while the adhesive coming into contact with the reformed region, and the optical glass can be well bonded to the casing.

Further, the distance a between the first principal surface 610A and the reformed region means a distance between a point where a peak count value Pc of the cut surface (value measured in the direction parallel to the principal surfaces) is confirmed in a direction from the first principal surface 610A to the second principal surface 610B to be greater than 20 for the first time and the first principal surface 610A.

Further, the distance b between the second principal surface 610B and the reformed region means a distance between a point where the peak count value Pc of the cut surface (value measured in the direction parallel to the principal surfaces) is confirmed in a direction from the second principal surface 610B to the first principal surface 610A to be greater than 20 for the first time and the second principal surface 610B.

In Expression (3) above, "(b−a)/2" represents a displacement amount between the middle of the reformed region R in the plate thickness direction and the plate thickness middle of the optical glass 600. Therefore, Expression (3) means that the displacement amount of the reformed region R to the first principal surface 610A side exceeds the plate thickness×2%, and when this relation is satisfied, the bonding strength of the optical glass to the casing can be improved.

As for the forming position of the reformed region R, when in the plate thickness direction of the glass substrate 610, the distance between the first principal surface 610A and the reformed region R is set to a, the distance between the second principal surface 610B and the reformed region R is set to b, the thickness of the glass substrate 610 is set to t, and the width of the reformed region R is set to k, it is more preferred that the reformed region should exist unevenly at the first principal surface 610A side so as to satisfy Expression (4) below.

$$0.05t < (b-a)/2 < 0.3t \qquad (4)$$

Here, the distance a and the distance b are numerical values greater than 0 (zero), which means that it is essential for the reformed region R to be formed apart from the respective principal surfaces. Further, the reformed region R is preferably formed a certain distance or more apart from the respective principal surfaces, and for example, the distance a and the distance b are each preferably equal to or more than the thickness t of the glass substrate 610×0.1 (namely, plate thickness×10%).

When (b−a)/2 exceeds 0.05t, the region where the reformed region adheres to the adhesive can be made large, to thereby make it possible to increase the bonding strength. Further, since (b−a)/2 is less than 0.3t, the bending strength of the second principal surface 610B does not decrease excessively. Note that the distance a and the distance b are numerical values greater than 0 (zero). That is, the reformed region R is formed apart from the respective principal surfaces.

The reformed region R is made to exist unevenly as above, thereby making it possible to increase the bonding strength of the optical glass to the casing. The reformed region R may also be formed between the middle of the glass substrate 610 and the first principal surface 610A in the plate thickness direction. That is, without ranging over the middle of the glass substrate 610, the reformed region R is formed only between the middle of the glass substrate 610 and the first principal surface 610A in the cut surface, thereby increasing the area where the adhesive and the reformed region R are in contact, resulting in that it is possible to increase the bonding strength.

The reformed region R and the remaining region in the cut surface of the optical glass 600 can be determined by the peak count value of the cut surface. The peak count value Pc means the number of peaks in an evaluation length, counted by a method of setting a range from a negative reference level (−H) to a positive reference level (+H) as one peak with a mean line of curves expressing a surface state (irregularities) of an object to be measured being the center, which is defined by American Society of Mechanical Engineers ASME B46.1 (1995).

In the present invention, the peak count value is first measured on the cut surface of the optical glass 600 in the direction parallel to the respective principal surfaces. This measurement is performed a plurality of times while changing the position in the plate thickness direction of the optical glass 600. Then, while using the peak count values on the cut surface of the optical glass 600 at the positions in the plate thickness direction, the peak count values Pc measured in the direction from the first principal surface 610A to the second principal surface 610B are confirmed and the distance between the measurement position where the peak count value Pc exceeds 20 for the first time and the first principal surface 610A is set to the distance a. In the same manner, while using the peak count values on the cut surface of the optical glass 600 at the positions in the plate thickness direction, the peak count values Pc measured in the direction from the second principal surface 610B to the first principal surface 610A are confirmed and the distance between the measurement position where the peak count value Pc exceeds 20 for the first time and the second principal surface 610B is set to the distance b.

As long as this peak count value measurement is performed while confirming a boundary position between the reformed region R and the remaining region based on an optical micrograph of the cut surface, the distance a and the distance b can be determined efficiently and precisely. Further, when the measurement position is changed to the plate thickness direction, the measurement is preferably performed at an interval equal to or less than the thickness t of the glass substrate 610×0.04 (namely plate thickness× 4%) in the vicinity of the boundary position between the reformed region R and the remaining region in particular. This enables more precise boundary position determination.

Incidentally, the peak count value of the cut surface can be obtained as the number of peaks defined by the following manner. Namely, one peak can be given by a form starting from a point exceeding below a dead zone set on a measured waveform measured in the direction parallel to the respective principal surfaces, via a point exceeding above the dead zone on the measured waveform, to a point again exceeding below the dead zone on the measured waveform as a unit. The width of the dead zone (the dead zone width) is given as the maximum height of the measured waveform×0.05 with respect to the mean line of the measured waveform as a center.

The measurement is performed using a laser microscope (shape measurement laser microscope VK-X100 and analysis software: VK-H1XA manufactured by KEYENCE CORPORATION), and its condition is set as follows: evaluation length (measurement width): 725 μm (magnification: 200 times); wavelength: 628 nm; and no measured waveform correction in the analysis software.

Even the bonding to the casing is considered and the position of the reformed region R in the glass substrate is selectively formed as above, thereby making it possible to enhance stability and reliability of a product.

Figure 10A:
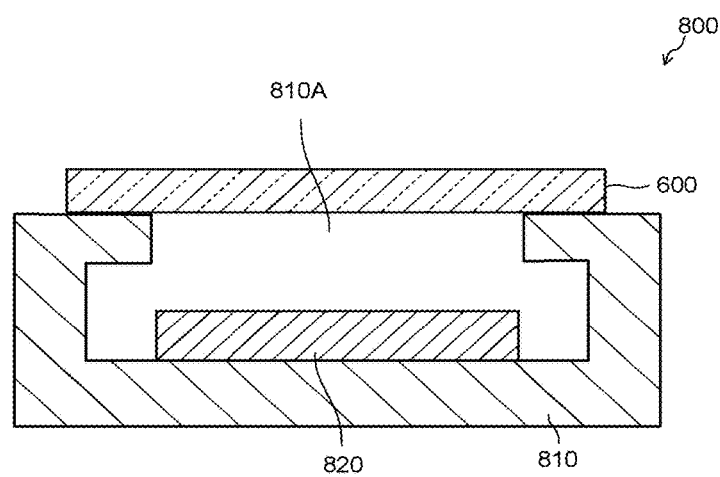
FIG. 10A is a view where the optical glass in FIG. 8A is applied to a casing.
Figure 10B:
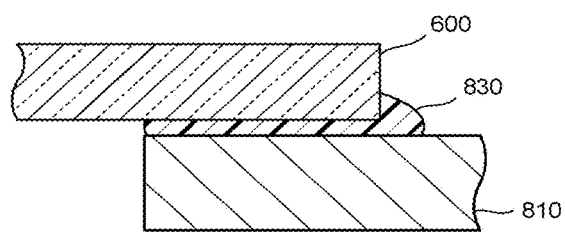
FIG. 10B is an enlarged view of a bonded portion of FIG. 10A.

The reason why the bonding strength of the optical glass can be increased by making the reformed region R exist unevenly is considered as follows. First, FIG. 10A illustrates a cross-sectional view of a semiconductor device 800 with the optical glass 600 applied to a casing 810, and FIG. 10B illustrates an enlarged view of a bonded portion of FIG. 10A. Here, the optical glass 600 is bonded to the casing 810 so as to cover an opening portion 810A of the casing 810. At this time, the bonding of the optical glass 600 to the casing 810 is made via an adhesive 830 as illustrated in FIG. 10B, and this adhesive 830 runs into the space between the optical glass 600 and the casing 810 and further runs around onto the cut surface (side surface) of the optical glass 600 to solidify. At this time, the bonding strength increases when surface roughness of the cut surface is rough, and therefore, by making the adhesive solidify so as to make the reformed region come into contact with the adhesive, the bonding strength can be increased.

Incidentally, the semiconductor device 800 described here is made by housing a semiconductor element 820 in the casing 810, the optical glass 600 of this embodiment is bonded to the casing 810 so as to cover the opening portion 810A of the casing 810, and the casing 810 is airtightly sealed. Here, the bonding is made by sealing the bonding region B of the first principal surface 610A of the optical glass 600 and a casing forming the opening portion 810A of the casing 810 with the adhesive 830 such as a thermosetting resin or an ultraviolet curing resin. Further, as long as being a well-known one, the semiconductor element 820 can be used without any limitation in particular, and solid state imaging devices (for example, a CCD and a CMOS) and the like are exemplified.

Further, the glass substrate 610 used in this embodiment is preferably formed of glass having fracture toughness in a range of 0.2 MPa·m$^{1/2}$ to 0.74 MPa·m$^{1/2}$ and having a thermal expansion coefficient in a range of $65 \times 10^{-7}$/K to $150 \times 10^{-7}$/K.

The fracture toughness of the glass substrate 610 is a value ($K_{1c}$) calculated by the following expression in the indentation fracture method (IF method) defined by JIS R1607.

$$K_{1c} = 0.026 \cdot E^{1/2} \cdot P^{1/2} \cdot a/C^{3/2}$$

Here, E represents a Young's modulus (Pa), P represents an indentation load (N), a represents ½ of the average of an indentation diagonal line length (m), and C represents ½ of the average of a crack length (m).

Further, the thermal expansion coefficient of the glass substrate 610 is an average value of values measured by the differential expression defined by JIS R3102 and measured at 100° C. to 300° C.

When the fracture toughness of the glass substrate 610 exceeds 0.74 MPa·m$^{1/2}$, cracks are unlikely to occur in the reformed region R at the time of forming the reformed region R in the glass substrate 610 by laser light, resulting in difficulty in cutting the glass substrate 610. Further, at the time of cutting the glass substrate 610 starting from the reformed region R, cracks are unlikely to extend in the plate thickness direction, so that the glass substrate 610 is forcedly cut, resulting in a rough cut surface of the glass substrate 610 and a decreased dimensional accuracy. Further, even if the cracks occurring in the reformed region R are formed to be large so as to sufficiently extend, cracks extending in directions other than the plate thickness direction become large, resulting in a rough cut surface of the glass substrate 610 after cutting. This may decrease the dimensional accuracy and the bending strength of the glass substrate 610.

On the other hand, when the fracture toughness of the glass substrate 610 is less than 0.2 MPa·m$^{1/2}$, cracks are likely to occur in the reformed region R at the time of forming the reformed region R in the glass substrate 610 by laser light, and therefore, cracks reaching the glass substrate 610 or the surface of the glass substrate 610 are formed from the reformed region R of the glass substrate 610, bringing about a problem that the cut glass substrate 610 is likely to be chipped or cracked. Further, even if cracks are formed to be small so as not to form into cracks starting from the reformed region R and reaching the glass substrate 610 or the surface of glass substrate 610, the cracks are likely to excessively extend starting from the reformed region R, and therefore, cracks extend also in directions other than the plate thickness direction, resulting in a rough cut surface of the glass substrate 610. This may decrease the dimensional accuracy and the bending strength of the glass substrate 610. Further, when the fracture toughness is less than 0.2 MPa·m$^{1/2}$, cracks existing in the cut surface of the glass substrate 610, even if minute, cause breakage, so that the glass substrate 610 after cutting may have a bending strength not enough for practical use.

When the thermal expansion coefficient of the glass constituting the glass substrate 610 exceeds $150 \times 10^{-7}$/K, cracks are formed too large in the reformed region R at the time of forming the reformed region R inside the glass by laser light, resulting in significant decrease in dimensional accuracy and bending strength of the optical glass 600 after cutting. On the other hand, when the thermal expansion coefficient of the glass substrate 610 is less than $65 \times 10^{-7}$/K, cracks are unlikely to occur in the reformed region R at the time of forming the reformed region R inside the glass by laser light, resulting in difficulty in cutting the optical glass 600.

The glass substrate 610 can be used by appropriately selecting from materials transparent in a visible wavelength region. For example, a borosilicate glass is processed easily and can suppress occurrence of flaws, foreign matters, and the like on an optical surface, thus being preferable, and a glass containing no alkaline component has good adhesiveness, weather resistance, and the like, thus being preferable.

As the glass to be used here, a fluorophosphate-based glass or a phosphate-based glass can also be used. A light absorption type glass having absorption in an infrared wavelength region, in which CuO and/or the like have/has been added to the fluorophosphate-based glass or phosphate-based glass, is preferable. Particularly, the fluorophosphate-based glass or phosphate-based glass having had CuO added thereto has high transmittance to light of a visible wavelength region, and additionally can give a good near-infrared light cut function because CuO sufficiently absorbs light of a near-infrared wavelength region.

Specific examples of the fluorophosphate-based glass containing CuO include glasses containing, in cation %, 20 to 45% of $P^{5+}$, 1 to 25% of $Al^{3+}$, 1 to 30% of $R^+$ (where $R^+$ is the total content of $Li^+$, $Na^+$, and $K^+$), 1 to 15% of $Cu^{2+}$, and 1 to 50% of $R^{2+}$ (where $R^{2+}$ is the total content of $Mg^{2+}$, $Ca^{2+}$, $Sr^{2+}$, $Ba^{2+}$, and $Zn^{2+}$), and in anion %, 10 to 65% of $F^-$, and 35 to 90% of $O^{2-}$. As a commercially available product, an NF-50 glass (manufactured by AGC TECHNO GLASS CO., LTD.) and the like are exemplified.

Specific examples of the phosphate-based glass containing CuO include glasses containing, in mass % in terms of the following oxides, 65 to 74% of $P_2O_5$, 5 to 10% of $Al_2O_3$, 0.5 to 3% of $B_2O_3$, 0 to 10% of $Li_2O$, 3 to 10% of $Na_2O$, 3 to 15% of $Li_2O+Na_2O$, 0 to 2% of MgO, 0 to 2% of CaO, 0 to 5% of SrO, 0 to 9% of BaO, 3 to 15% of MgO+CaO+SrO+BaO, and 0.5 to 20% of CuO, where $Na_2O/(Li_2O+MgO+CaO+SrO+BaO)$ is 0.5 to 3. Incidentally, a glass composition is not limited to the ones described above, and an appropriate glass can be used.

The thickness of the glass substrate 610 is not limited in particular, but from the standpoints of reduction in size and reduction in weight, the 0.1 to 3 mm range is preferable, the 0.1 to 1 mm range is more preferable, and the 0.1 to 0.5 mm range is further preferable.

Figure 11:
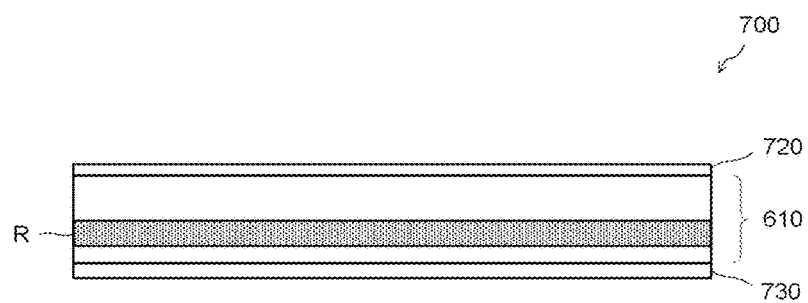
FIG. 11 is a side view of the optical glass in FIG. 8A with optical thin films provided thereon.

Further, in the optical glass of this embodiment, an optical thin film can also be formed on the principal surfaces of the glass substrate 610 as necessary. For example, FIG. 11 illustrates an optical glass to be used as an infrared cut filter as an example, and an optical glass 700 is made by including: the glass substrate 610; an optical thin film 720 formed on the second principal surface 610B of the glass substrate 610; and an optical thin film 730 formed on the first principal surface 610A of the glass substrate 610.

Here, the optical thin film 730 is an anti-reflection film, and is provided on the first principal surface 610A of the glass substrate 610 to be the side bonded to the casing. The optical thin film 730 decreases reflectance of the principal surface of the optical glass 600 to increase its transmittance. The optical thin film 730 is composed, for example, of a single layer film of $MgF_2$, a multilayer film made by stacking a mixture film of $Al_2O_3.TiO_2$ and $ZrO_2$ and $MgF_2$, an alternate multilayer film of $SiO_2.TiO_2$, or the like. These single layer•multilayer films are formed on the first principal surface 610A of the glass substrate 610 by a film forming method such as vacuum deposition or sputtering. Further, the physical film thickness of the optical thin film 730 is preferably 0.2 μm to 8 μm.

Further, the optical thin film 720 is a UVIR cut film that cuts ultraviolet light (UV) and infrared light (IR), and is provided on the second principal surface 610B of the glass substrate 610. The optical thin film 720 is composed, for example, of a multilayer film made by stacking dielectric films different in refractive index such as $SiO_2.TiO_2$, a resin film containing an ultraviolet absorbent and an infrared absorbent, or the like. The multilayer film can be formed on the second principal surface 610B of the glass substrate 610 by a film forming method such as vacuum deposition or sputtering, and the resin film can be formed on the second principal surface 610B of the glass substrate 610 by a well-known film forming method in which a resin dispersed or dissolved in a solvent is applied to be dried. Further, the physical film thickness of the optical thin film 720 is preferably 0.2 μm to 8 μm.

Incidentally, although the optical thin film 730 is provided on the first principal surface 610A of the glass substrate 610 and the optical thin film 720 is provided on the second principal surface 610B of the glass substrate 610 in the above-described explanation, it is also possible that the optical thin film 730 is provided on the second principal surface 610B of the glass substrate 610 and the optical thin film 720 is provided on the first principal surface 610A of the glass substrate 610. Further, the optical thin films 720 and 730 may also be provided on the first principal surface 610A of the glass substrate 610 and the optical thin films 720 and 730 may also be provided on the second principal surface 610B of the glass substrate 610. Further, when the glass substrate 610 can sufficiently absorb light in a near-infrared wavelength region, only the optical thin film to cut ultraviolet light (UV) may also be provided as the optical thin film 720.

The optical glass in this embodiment can be manufactured by the method similar to that of the optical glass in the first embodiment, and therefore the manufacturing method of the optical glass in this embodiment is omitted.

As above, according to the cutting method of the glass plate and the glass substrate according to this embodiment, cracks occur starting from the reformed region R formed inside the glass plate, so that the glass plate can be easily cut. Further, by pulling the glass plate in a planar direction, the cracks formed in the reformed region R are likely to extend in the plate thickness direction of the glass substrate, thus making the cut surface of the glass substrate unlikely to be rough and making it possible to obtain the optical glass 600 having an excellent dimensional accuracy.

Figure 12:
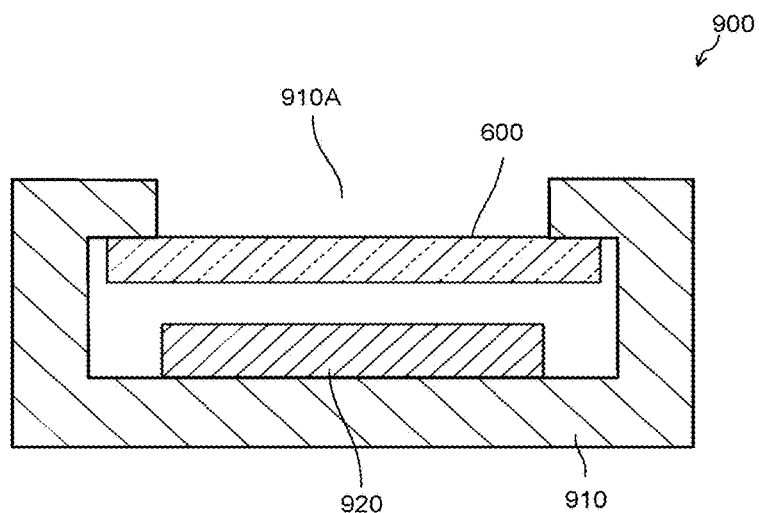
FIG. 12 is a view where the optical glass in FIG. 8A is applied to a casing of another embodiment.

Incidentally, as another embodiment obtained by modifying the second embodiment, FIG. 12 illustrates a cross-sectional view of a semiconductor device 900 in which the optical glass 600 is applied to a casing 910. Here, the optical glass 600 is bonded to the casing 910 so as to cover an opening portion 910A of the casing 910. In this embodiment, the first principal surface of the optical glass 600 is bonded to the casing 910 from the inside of the device, and therefore a reformed region is unevenly formed at the casing 910 side.

EXAMPLES

Hereinafter, the present invention will be explained in detail based on Examples and Comparative examples, but the present invention is not limited only to Examples.

Example 1-1 to Example 1-7

In the following explanation, Example 1-1 to Example 1-4 are Examples in the present invention, and Example 1-5 to Example 1-7 are Comparative examples in the present invention.

As the glass substrate, a plate-shaped fluorophosphate glass (NF-50 manufactured by AGC TECHNO GLASS CO., LTD., plate thickness of 0.295 to 0.296 mm, dimensions of 100 mm×100 mm) was prepared. This glass substrate is a glass in the composition range of the above specific examples described as the phosphate-based glass containing CuO. This glass substrate has a thermal expansion coefficient of $129\times10^{-7}$/K and has fracture toughness of 0.44 MPa·m$^{1/2}$.

In each of Examples, on one surface of this glass substrate, an anti-reflection film (AR, alternate multilayer film of $SiO_2$ and $TiO_2$) having a film thickness of 0.7 μm in total was formed as illustrated in Table 1, and on the other surface of this glass substrate, an infrared reflection film (IRCF, alternate multilayer film of $SiO_2$ and $TiO_2$) having a film thickness of 6.4 μm in total was formed as illustrated in Table 1, and the glass substrate for infrared cut filter was made. This glass substrate was cut into square shapes of 5 mm×5 mm under cutting conditions illustrated below, and optical glasses each having a cut surface with a reformed region existing unevenly on their side surfaces were manufactured.

The following conditions were used in the step of selectively forming the reformed region inside the glass substrate. A YAG laser (with a center wavelength of 1064 nm) was used as the laser light source and modulated to make laser light with a center wavelength of 532 nm incident on the glass substrate. Further, for the laser output, an appropriate output was selected from 5 to 13 μJ/pulse so as to obtain the reformed region illustrated in Table 1. The laser light was adjusted so as to be incident from the principal surface side with the anti-reflection film formed thereon in the plate direction of the glass substrate to be focused at a predetermined position.

Next, the glass substrate having had the reformed region formed therein was bonded to an expansible resin film and the resin film was pulled in the planar direction of the glass substrate, to thereby extend cracks formed in the reformed region up to the principal surface of the glass substrate starting from the reformed region of the glass substrate, and thereby fracture occurred in the thickness direction of the glass substrate and the glass substrate was cut along the reformed region.

The bending strength of the first principal surface side and the bending strength of the second principal surface side were measured referring to the 4-point bending strength test of JIS R 1601 (2008). Since the test piece was a square shape of 5 mm×5 mm in size, a fulcrum pitch was set to 3 mm, a load point pitch was set to 1 mm, and a radius of curvature of tips of support members of the fulcrum and the load point was set to 0.25 mm. Further, the bending strength was measured in 16 plates for one condition, and with the use of their average value, the bending strength of the first principal surface side when the bending strength of the second principal surface side of each of Examples was set to 1 was indicated by a ratio (of the bending strength of the first principal surface side/the bending strength of the second principal surface side). Incidentally, the bending strength of the second principal surface side was greater than 100 MPa in all Examples. Further, in the optical glasses in Examples 1-1 to Example 1-4, the bending strength of the first principal surface side was greater than 300 MPa.

Figure 13:
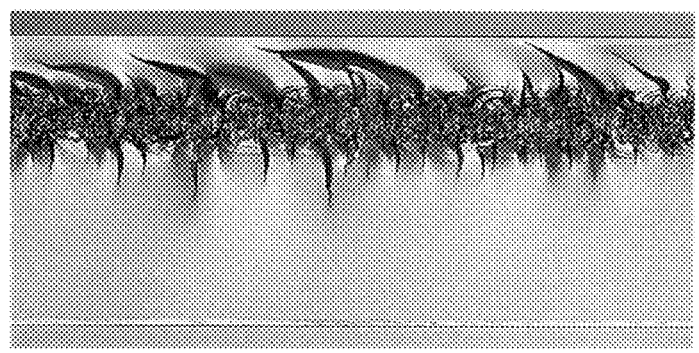
FIG. 13 is an optical micrograph of a side surface (cross section) of an optical glass obtained in Example 1-1.

The process condition, parameters of the positional relationships of the reformed region in the cut surface of the obtained optical glass (t, a, b, and k in FIG. 2), the bending strength of the first principal surface side, and the bending strength of the second principal surface side at this time are illustrated in Table 1 in a summary form. Incidentally, the position of the reformed region was measured in each eight plates every condition, and their average value was indicated. Further, in FIG. 13, an optical micrograph of the side surface (cross section) of the optical glass of Example 1-1 was shown.

Further, the optical glasses of Example 1-3 and Example 1-4 are preferably applied to the casing 310 illustrated in FIG. 3 because the bending strength of the first principal surface side with the anti-reflection film formed thereon is high. Further, the optical glasses of Example 1-1 and Example 1-2 are preferably applied to the casing 410 illustrated in FIG. 7 because the bending strength of the first principal surface side with the infrared reflection film formed thereon is high.

As described above, the reformed region is made to exist unevenly at the second principal surface side, thereby making it possible to adjust the bending strength of the principal surface of the optical glass, and the surface with a high bending strength is set to a bonding surface to the casing, thereby making it possible to manufacture a semiconductor device in which breakage is suppressed against external impact.

Example 2-1 to Example 2-4

In the following explanation, Examples 2-1 to 2-3 are Examples of the present invention, and Example 2-4 is Comparative example of the present invention.

TABLE 1

| | | Unit | Example 1-1 | Example 1-2 | Example 1-3 | Example 1-4 | Example 1-5 | Example 1-6 | Example 1-7 |
|---|---|---|---|---|---|---|---|---|---|
| Process condition | Radiation pitch | μm | 10 | 10 | 10 | 10 | 10 | 10 | 10 |
| Modified region | Plate thickness t | μm | 295 | 295 | 295 | 296 | 295 | 295 | 296 |
| | Distance a | μm | 211 | 160 | 119 | 188 | 116 | 111 | 115 |
| | Distance b | μm | 38 | 72 | 100 | 53 | 105 | 110 | 106 |
| | Width k | μm | 46 | 63 | 76 | 55 | 74 | 74 | 75 |
| | (a − b)/2/plate thickness | % | 29% | 15% | 3.2% | 23% | 1.9% | 0.2% | 1.5% |
| Optical thin film | First principal surface side | — | IRCF | IRCF | AR | AR | IRCF | AR | AR |
| | Second principal surface side | — | AR | AR | IRCF | IRCF | AR | IRCF | IRCF |
| Bending strength (Ratio) | First principal surface | — | 4.25 | 1.83 | 1.33 | 2.63 | 1.25 | 0.97 | 1.15 |
| | Second principal surface | — | 1 | 1 | 1 | 1 | 1 | 1 | 1 |

Table 1 reveals that by making the reformed region unevenly exist at the second principal surface side, the bending strength of the first principal surface side can be made equal to or more than 1.3 times larger than the bending strength of the second principal surface side (Example 1-1 to Example 1-4). On the other hand, when the reformed region is formed in substantially the middle, the bending strength of the first principal surface side and the bending strength of the second principal surface side become substantially equal (Example 1-5 to Example 1-7). It is found out this time that the reformed region exists unevenly at the second principal surface side so that the displacement amount between the middle of the reformed region R and the plate thickness middle becomes greater than the plate thickness×2%, to thereby generate a distinct strength difference between the bending strength of the first principal surface side and the bending strength of the second principal surface side. Further, the larger the degree of unevenness becomes, the more the strength difference between the both increases. However, when the reformed region exists unevenly at the second principal surface side so that the displacement amount between the middle of the reformed region R and the plate thickness middle becomes greater than the plate thickness× 30%, it is inferred that the bending strength of the first principal surface side falls below 100 MPa. When the bending strength of the first principal surface side becomes less than 100 MPa, the strength of the optical glass becomes equal to or less than that of a glass mechanically processed by a conventional grinding wheel, resulting in that breakage may occur by external impact even at the second principal surface side.

As the glass substrate, a plate-shaped fluorophosphate glass (NF-50 manufactured by AGC TECHNO GLASS CO., LTD., plate thickness of 0.295 to 0.300 mm, dimensions of 100 mm×100 mm) was prepared. This glass substrate is a glass in the composition range of the above specific examples described as the fluorophosphate-based glass containing CuO. This glass substrate has a thermal expansion coefficient of $129×10^{-7}$/K and has fracture toughness of 0.44 MPa·m$^{1/2}$.

In each of Examples, on one surface of this glass substrate, an anti-reflection film (AR, alternate multilayer film of $SiO_2$ and $TiO_2$) having a film thickness of 0.7 μm in total was formed as illustrated in Table 2, and on the other surface of this glass substrate, an ultraviolet and infrared reflection film (UVIR, alternate multilayer film of $SiO_2$ and $TiO_2$) having a film thickness of 6.4 μm in total was formed as illustrated in Table 2, and the glass substrate for infrared cut filter was made. This glass substrate was cut into square shapes of 5 mm×5 mm under cutting conditions illustrated below, and optical glasses each having a cut surface with a reformed region existing unevenly on their side surface were manufactured.

The following conditions were used in the step of selectively forming the reformed region inside the glass substrate. A YAG laser (with a center wavelength of 1064 nm) was used as the laser light source and modulated to make laser light with a center wavelength of 532 nm incident on the glass substrate. Further, for the laser output, an appropriate output was selected from 5 to 13 μJ/pulse so as to obtain the reformed region illustrated in Table 2. The laser light was adjusted so as to be incident from the principal surface side with the anti-reflection film formed thereon in the plate thickness direction of the glass substrate to be focused at a predetermined position.

Next, the glass substrate having had the reformed region formed therein was bonded to an expansible resin film and the resin film was pulled in the planar direction of the glass substrate, to thereby extend cracks formed in the reformed region up to the principal surface of the glass substrate starting from the reformed region of the glass substrate, and thereby fracture occurred in the thickness direction of the glass substrate and the glass substrate was cut along the reformed region.

An adhesion test was performed by the following method. A square-shaped test piece of 5 mm×5 mm was used, and an outer periphery (four sides) of a first principal surface of the test piece was (were) bonded to an alumina ceramic product provided with an opening portion that imitated a casing of a solid state imaging device with a commercially-available adhesive so as to make the first principal surface of the test piece become a casing side. Next, after the adhesive became stiff, the alumina ceramic product part was sandwiched to be fixed, and a substantially center portion of the first principal surface side was pushed with a pin with a tip portion sphere radius of 1.5 mm at a speed of 1 mm/minute so that the second principal surface side became convex, and it was confirmed whether the test piece was peeled off from the alumina ceramic product with the upper limit of a load set to 20 N. This was performed with 10 pieces in each Example and the number of pieces that were peeled off was confirmed visually.

Figure 14:
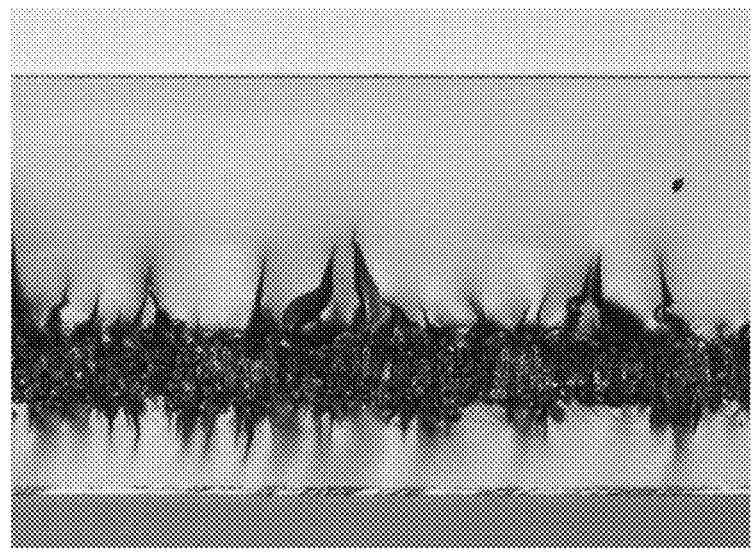
FIG. 14 is an optical micrograph of a side surface (cross section) of an optical glass obtained in Example 2-3.

The process condition, parameters of the positional relationships of the reformed region in the cut surface of the obtained optical glass (t, a, b, and k in FIG. 9), and the number of peeling occurrence pieces in the adhesion test at this time are illustrated in Table 2 in a summary form. Incidentally, the position of the reformed region was measured in each eight plates every condition, and their average value was indicated. Further, in FIG. 14, an optical micrograph of the side surface (cross section) of the optical glass of Example 2-3 was shown.

TABLE 2

|  |  | Unit | Example 2-1 | Example 2-2 | Example 2-3 | Example 2-4 |
|---|---|---|---|---|---|---|
| Process condition | Radiation pitch | μm | 10 | 10 | 10 | 10 |
| Modified region | Plate thickness t | μm | 300 | 295 | 295 | 300 |
|  | Distance a | μm | 35 | 72 | 38 | 115 |
|  | Distance b | μm | 212 | 160 | 211 | 123 |
|  | Width k | μm | 54 | 63 | 46 | 63 |
|  | (a − b)/2/plate thickness | % | 29.5% | 14.8% | 29.2% | 1.3% |
| Optical thin film | First principal surface side | — | AR | AR | AR | UVIR |
|  | Second principal surface side | — | UVIR | UVIR | UVIR | AR |
| Adhesion test | Number of peeling occurrence pieces |  | 0/10 | 0/10 | 0/10 | 0/10 |

Table 2 reveals that peeling between the alumina ceramic product and the test piece did not occur in the adhesion test, and therefore by making the reformed region exist unevenly at the first principal surface side in each of the glasses of Examples, the bonding strength of the glass substrate to the casing can be increased.

As described above, the reformed region is made to exist unevenly at the first principal surface side, and thereby the bonding strength of the optical glass to the casing can be adjusted and sealing performance is improved, resulting in that it is possible to manufacture a semiconductor device having good reliability and stability.

The optical glass of the present invention is suitably used for a cover glass, a near-infrared cut filter, or the like of a semiconductor device to be internally housed in an electronic device (for example, a device having a solid state imaging device (a CCD, a CMOS or the like), and is suitable for portable electronic devices such as a mobile phone and a smart phone in particular.

What is claimed is:

1. An optical glass, comprising:
a glass substrate having a plate-shape comprising a first principal surface adapted to be bonded to a casing, a second principal surface being the opposite to the first principal surface and an end surface; and
a reformed region formed on the end surface at a closer position to the second principal surface than the first principal surface, made by light radiated to be focused thereto,
wherein the reformed region satisfies the expression:

$$0.02t < (a-b)/2 < 0.3t$$

where
a is a distance between the first principal surface and the reformed region in a plate thickness direction of the glass substrate,
b is a distance between the second principal surface and the reformed region in the plate thickness direction,
t is a plate thickness of the optical glass, and
a and b are numerical values greater than 0.
2. The optical glass according to claim 1, wherein the reformed region satisfies Expression (2):

$$0.05t < (a-b)/2 < 0.3t \ldots (2).$$

3. The optical glass according to claim 1, wherein the reformed region is formed between the middle of the optical glass and the second principal surface in the plate thickness direction of the optical glass.
4. The optical glass according to claim 1, wherein the optical glass further comprises an optical thin film on at least one of the first principal surface and the second principal surface, and the optical thin film is at least one selected from the group consisting of an anti-reflection film, an infrared absorption film, and an ultraviolet absorption film.
5. The optical glass according to claim 1, wherein the casing houses a semiconductor element therein.
6. The optical glass according to claim 5, wherein the semiconductor element is a solid state imaging device.
7. A semiconductor device comprising:
a casing,
a semiconductor element housed in the casing, and a optical glass according to claim 1 having the first principal surface bonded to the casing.

* * * * *